(12) United States Patent
Zhang

(10) Patent No.: US 7,110,059 B2
(45) Date of Patent: Sep. 19, 2006

(54) DISPLAY DEVICE

(75) Inventor: Hongyong Zhang, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 11/002,659

(22) Filed: Dec. 3, 2004

(65) Prior Publication Data

US 2005/0099557 A1    May 12, 2005

Related U.S. Application Data

(60) Continuation of application No. 09/816,492, filed on Mar. 23, 2001, which is a continuation of application No. 09/062,874, filed on Apr. 20, 1998, now Pat. No. 6,219,118, which is a division of application No. 08/646,512, filed on May 7, 1996, now Pat. No. 5,777,701.

(30) Foreign Application Priority Data

May 8, 1995    (JP)    .................................. 7-134810
Feb. 21, 1996    (JP)    .................................. 8-058500

(51) Int. Cl.
    *G02F 1/136*    (2006.01)
(52) U.S. Cl. ........................................ 349/44; 349/139
(58) Field of Classification Search .................. 349/42, 349/43, 44, 38, 139, 110
    See application file for complete search history.

(56) References Cited

U.S. PATENT DOCUMENTS

| 4,759,610 A | 7/1988 | Yanagisawa |
| 4,948,231 A | 8/1990 | Aoki et al. |
| 5,003,356 A * | 3/1991 | Wakai et al. ............... 257/390 |
| 5,051,570 A | 9/1991 | Tsujikawa et al. |
| 5,162,933 A | 11/1992 | Kakuda et al. |
| 5,182,620 A | 1/1993 | Shimada et al. |
| 5,185,601 A | 2/1993 | Takeda et al. |
| 5,317,433 A | 5/1994 | Miyawaki et al. |
| 5,327,001 A | 7/1994 | Wakai et al. |
| 5,339,181 A | 8/1994 | Kim et al. |
| 5,459,595 A | 10/1995 | Ishiguro et al. |
| 5,459,596 A | 10/1995 | Ueda et al. |
| 5,499,123 A | 3/1996 | Mikoshiba |
| 5,500,538 A | 3/1996 | Yamazaki et al. |
| 5,517,341 A | 5/1996 | Kim et al. |
| 5,585,951 A | 12/1996 | Noda et al. |
| 5,641,974 A | 6/1997 | Den Boer et al. |

(Continued)

FOREIGN PATENT DOCUMENTS

JP    01-183628    7/1989

(Continued)

OTHER PUBLICATIONS

Office Action (U.S. Appl. No. 09/816,492), Apr. 5, 2005, 8 pages.

(Continued)

*Primary Examiner*—Toan Ton
(74) *Attorney, Agent, or Firm*—Fish & Richardson P.C.

(57) ABSTRACT

A metal electrode also serving as a black matrix is so formed as to cover the periphery of an ITO pixel electrode. A region where the pixel electrode and the metal electrode coextend also serves as an auxiliary capacitor. Since the auxiliary capacitor can be formed by using a thin insulating film, it can have a large capacitance. By virtue of the structure in which the black matrix also serves as the auxiliary capacitor, it is not necessary to provide an electrode dedicated to the auxiliary capacitor, thereby preventing reduction in aperture ratio. Further, the black matrix can completely shield a source line and a gate line from light.

44 Claims, 3 Drawing Sheets

U.S. PATENT DOCUMENTS

| | | |
|---|---|---|
| 5,694,185 A | 12/1997 | Oh |
| 5,708,485 A | 1/1998 | Sato et al. |
| 5,717,224 A | 2/1998 | Zhang |
| 5,744,821 A | 4/1998 | Song |
| 5,784,132 A | 7/1998 | Hashimoto |
| 5,805,247 A | 9/1998 | Oh-e et al. |
| 5,870,158 A | 2/1999 | Abe et al. |
| 5,956,103 A | 9/1999 | Ishiguro |
| 2001/0035919 A1 | 11/2001 | Zhang |

FOREIGN PATENT DOCUMENTS

| | | |
|---|---|---|
| JP | 04-194823 | 7/1992 |
| JP | 05-127195 | 5/1993 |
| JP | 05-181159 | 7/1993 |
| JP | 05-257164 | 10/1993 |
| JP | 06-011728 | 1/1994 |
| JP | 06-148684 | 5/1994 |
| JP | 07-248507 | 9/1995 |

OTHER PUBLICATIONS

Pending Claims in Appl. No. 09/816,492 filed Mar. 23, 2001 (6 pages).

* cited by examiner

DISPLAY DEVICE

CROSS-REFERENCE TO RELATED APPLICATIONS

This application is a continuation application of U.S. application Ser. No. 09/816,492, filed Mar. 23, 2001, now allowed, which is a continuation of U.S. application Ser. No. 09/062,874, filed Apr. 20, 1998, now U.S. Pat. No. 6,219,118, which is a divisional of U.S. application Ser. No. 08/646,512, filed May 7, 1996, now U.S. Pat. No. 5,777,701, which claims the benefit of foreign priority applications filed in Japan as Ser. No. 07-134810 on May 8, 1995 and as Ser. No. 08-058500 on Feb. 21, 1996. This application claims priority to each of these prior applications, and the disclosures of the prior applications are considered part of (and are incorporated by reference in) the disclosure of this application.

BACKGROUND OF THE INVENTION

1. Field of the Invention

The present invention relates to the structure of a pixel region of an active matrix display device and, more specifically, to the structure of a black matrix (BM) and auxiliary capacitors that are connected in parallel to respective pixel electrodes.

Further, the invention generally relates to the structure of a pixel region of flat panel displays that require a black matrix.

2. Description of the Related Art

Active matrix liquid crystal display devices are known, in which at least one thin-film transistor is connected to each of a number of pixel electrodes which are arranged in a matrix form, and charging, and discharging of each pixel electrode is controlled by the associated thin-film transistor.

Each pixel electrode constitutes a capacitor together with a counter electrode that is opposed to the pixel electrode with a liquid crystal therebetween.

In actual operation, however, since the capacitance of the capacitor constituted by each pixel electrode portion is not sufficiently large, an auxiliary capacitor is desired. However, when an electrode of the auxiliary capacitor is made of a conductive material such as a metal, it acts as a light-shielding portion in each pixel, resulting in a decrease of the aperture ratio.

On the other hand, a light-shielding member called "black matrix" is needed around each pixel electrode.

In general, regions where source lines (wiring lines for supplying currents to the respective source regions of the thin-film transistors) and gate lines (wiring lines for applying signal voltages to the respective gate electrodes of the thin-film transistors) are arranged in a matrix form have an uneven surface. As a result, a rubbing operation on an orientation film can not be performed properly in those regions, so that the orientation of liquid crystal molecules may be disordered there. This may cause a phenomenon that light leaks undesirable or, conversely, a desired quantity of light is not transmitted around the pixels. Further, the liquid crystal may be disabled from performing a desired electro-optical operation in the above regions.

If the above phenomenon occurs, a displayed image is blurred around the pixels, to thereby impair clearness of the image as a whole.

There is known a structure for solving the above problems in which structure a light-shielding film is so formed as to cover the edges of the pixel electrodes. The light-shielding film is called "black matrix" (BM).

U.S. Pat. No. 5,339,151 discloses a structure including a black matrix. In this technique, as shown in FIG. 2C of this patent, a black matrix extending from gate lines is so formed as to overlap with the edges of pixel electrodes. This structure is adapted to form auxiliary capacitors in overlapping portions of the black matrix and the pixel electrodes.

However, the technique of this patent has the following two problems. First, since the black matrix extends from the gate lines. First shielding is not complete. This is because source lines cannot be overlapped with the black matrix to avoid crosstalk. Light leakage should be tolerated in those portions.

Second, since the black matrix occupies the same plane as the gate lines, naturally it cannot perform light shielding for the sate lines themselves. Further, the black matrix cannot perform light shielding for the source lines to avoid crosstalk as described above.

With the recent development of digital equipments, influences of electromagnetic waves from low-frequency waves to microwaves have come to cause problems. In an environment where a liquid crystal electro-optical device is used, there is concern about the influences of electromagnetic waves.

Therefore, liquid crystal display devices need to be so constructed as to be insensitive to external electromagnetic waves.

In view of the above, the above structure as described in U.S. Pat. No. 5,339,181 in which the source lines and sate lines which transmit image signals are exposed to external electromagnetic waves is not preferable, because the source lines and gate lines may serve as an antenna.

SUMMARY OF THE INVENTION

An object of the present invention is to provide a pixel structure of an active matrix liquid crystal display device which structure enables effective light shielding by means of a black matrix.

Another object of the invention is to provide a structure capable of protecting the entire device from being influenced by external electromagnetic waves.

A further object of the invention is to form auxiliary capacitors having a necessary capacitance without reducing the aperture ratio.

According to a first aspect of the invention, there is provided a display device (as shown in FIGS. 1 and 2) comprising:

source lines 113 and gate lines 110 arranged in a matrix form;

at least one pixel electrode 113 disposed in each region that is enclosed by the source lines 113 and the gate lines 110; and a light shielding electrode 116 so disposed as to cover the source lines 113 and the gate lines 110, wherein a periphery of the pixel electrode 118 overlaps with the light shielding electrode 116, and a coextending region 119 or 120 thereof serves as an auxiliary capacitor.

With this configuration, all the components other than the pixel electrode 118 and a drain region 106 of a thin-film transistor 103 can be shielded from incident light. In particular, the source lines 113 and the gate lines 110 can completely be shielded from the exterior. This prevents an event that external electromagnetic waves are received by the source lines 113 and the gate lines 110 to cause an erroneous or faulty operation of the device.

Auxiliary capacitors can be formed without reducing the aperture ratio.

In the above configuration, the pixel electrode 113 is a transparent conductive film made of ITO, for instance. While one pixel electrode is provided in each pixel in the basic configuration, the pixel electrode of each pixel may be divided into a plurality of parts.

The black matrix 116, which is so disposed as to overlap with the periphery of the pixel electrode 115, is made of titanium or chromium. The black matrix 116 serves as not only the light-shielding film but also one of the electrodes constituting an auxiliary capacitor.

It is preferable that the metal electrode 116 be so formed as to overlap with the periphery of the pixel electrode 118 over its entire circumference. FIGS. 3A–3E are plan views for explaining the locational relationship of each element of FIG. 2.

According to another aspect of the invention, there is provided, as exemplified in FIGS. 1 and 2, a display device comprising:
  source lines 113 and sate lines 110 arranged in a matrix form; at least one pixel electrode 118 disposed in each region that is enclosed by the source lines 113 and the gate lines 110; and
  a light-shielding electrode 116 so disposed as to overlap with a periphery of the pixel electrode 118,
  wherein the pixel electrode 118 and the light-shielding electrode 116 constitute a capacitor through an insulating film 117, and wherein the light-shielding electrode 116 exists in a different layer than the source lines 113 and the gate lines 110.

According to a further-aspect of the invention, there is provided, as exemplified in FIGS. 1 and 2, a display device comprising in an order as written from the side of incident light (i.e., from the top of FIG. 1):
  a pixel electrode 118;
  a light-shielding electrode 116;
  a source line 113; and
  a sate line 110,
  wherein the pixel electrode 118 and the light-shielding electrode 116 constitute a capacitor 119 or 120 in between.

In this configuration, by disposing the pixel electrode 118 closest to the incident light side and disposing the light-shielding electrode (black matrix) 116 next to the pixel electrode 118, the underlaid source line 113, gate line 110, and thin-film transistor (except for a drain region 106) can completely be shielded from incident light.

This configuration is very useful for not only light shielding but also elimination of influences of external electromagnetic waves.

Further, the capacitors 119 and 120 can be formed without reducing the aperture ratio.

DETAILED DESCRIPTION OF THE PREFERRED EMBODIMENTS

Figure 1:
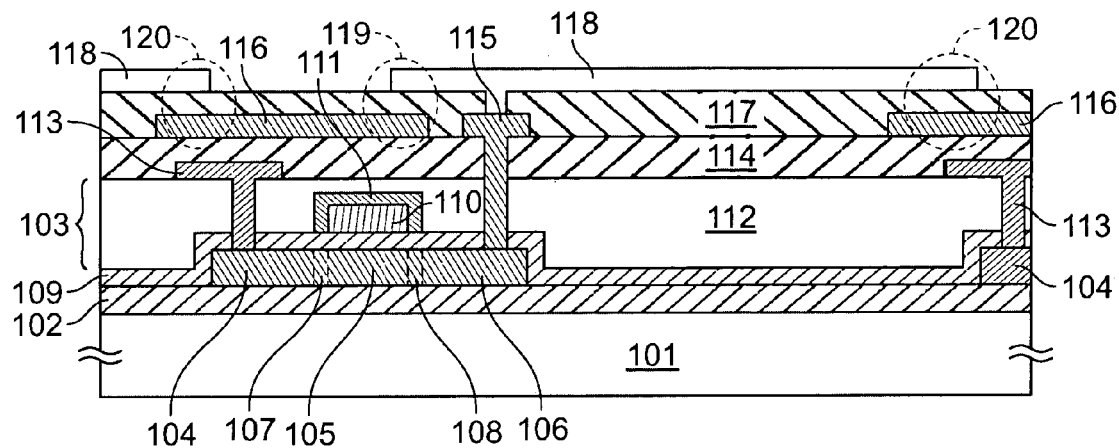
FIG. 1 is a sectional view showing the structure of a pixel region of an active matrix liquid crystal display device.
Figure 2:
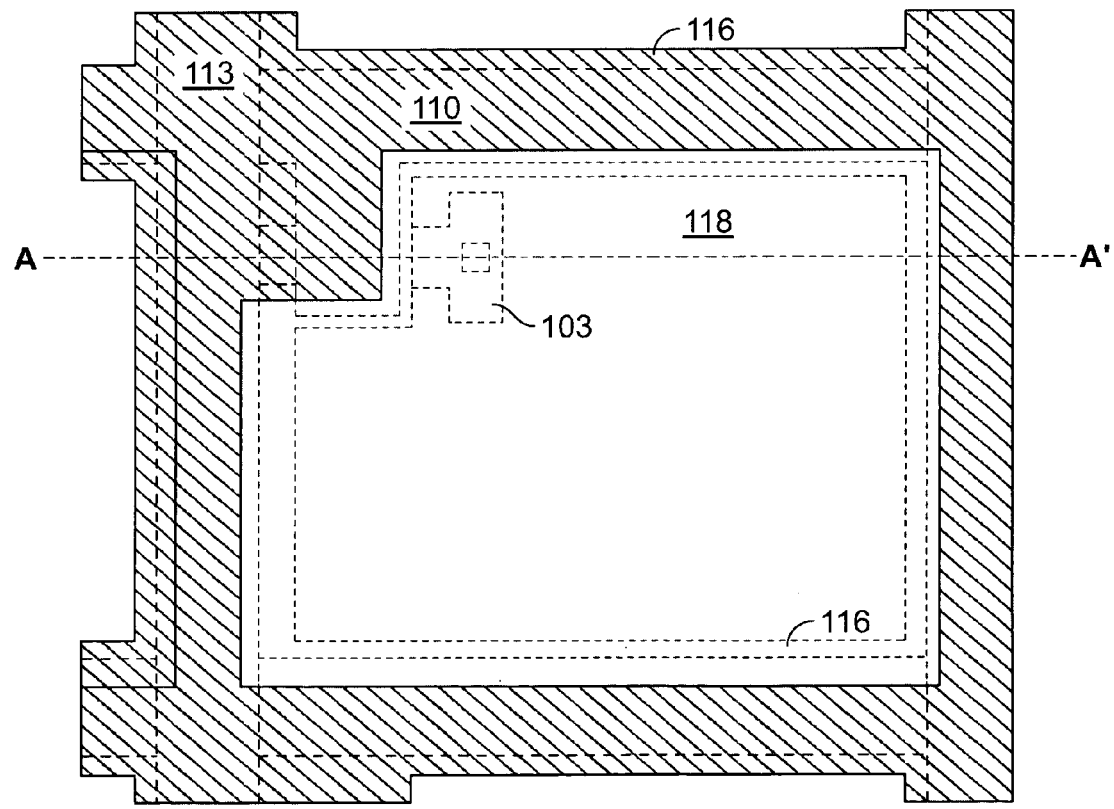
FIG. 2 is a top view of the pixel region of FIG. 1.
Figure 3A:
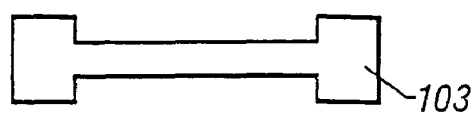
FIGS. 3A–3E are plane views for showing the locational relationship of each element of FIG. 2.
Figure 3B:
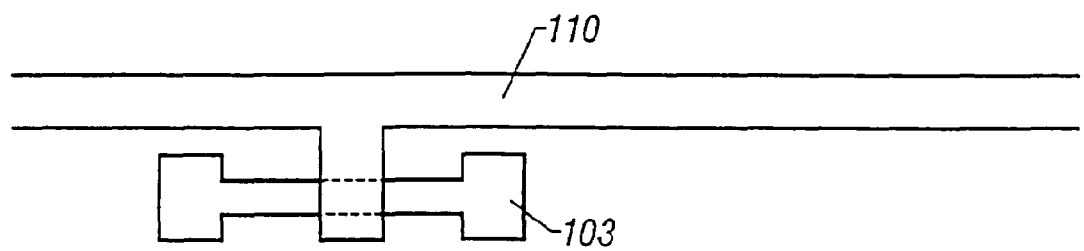
Figure 3C:
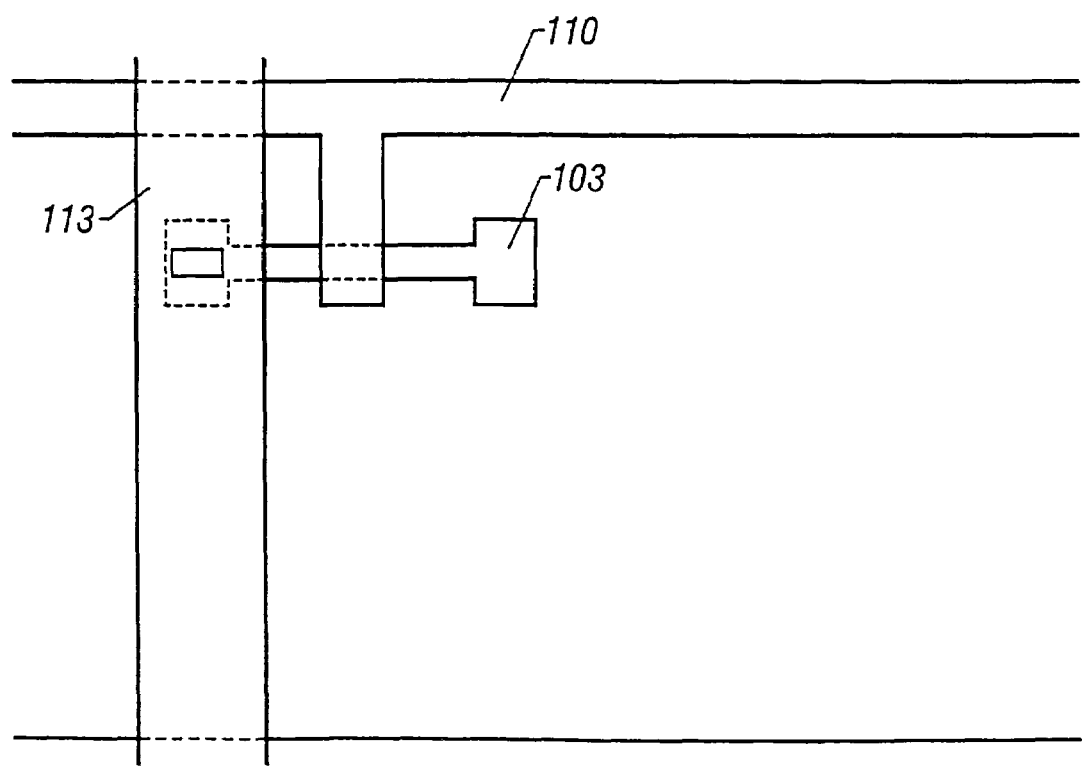
Figure 3D:
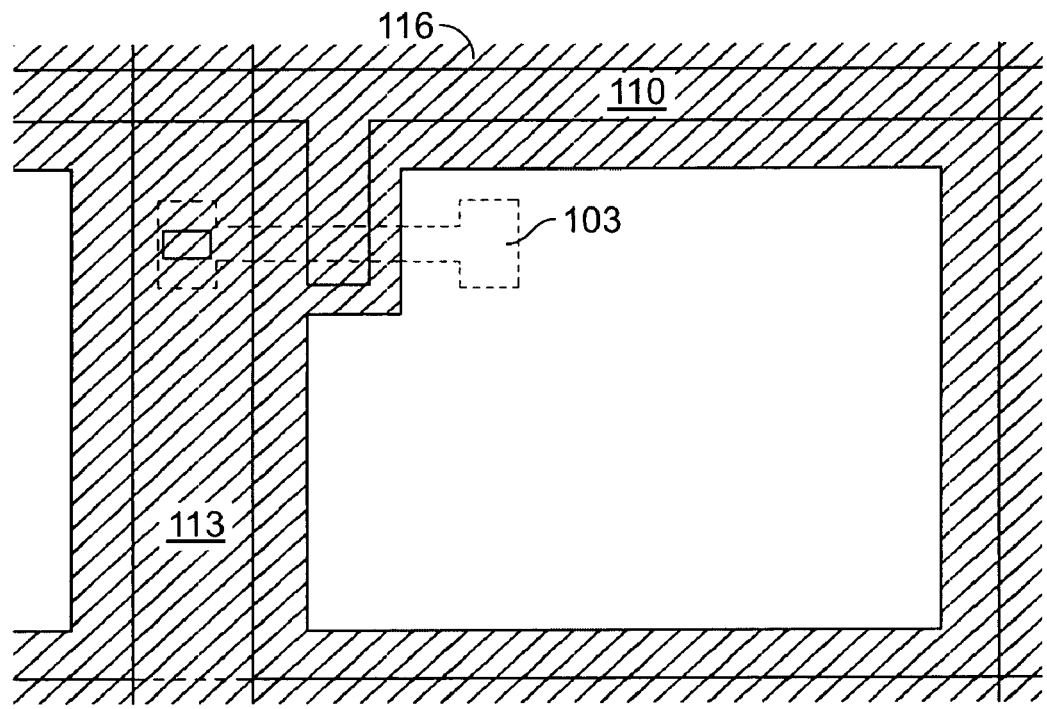
Figure 3E:
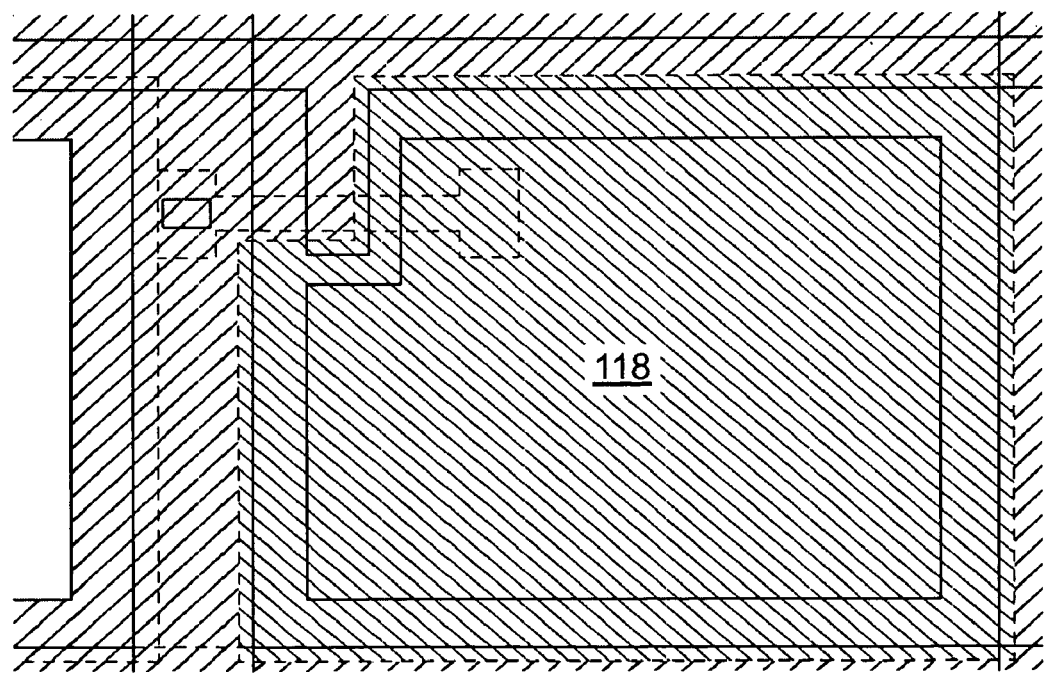

FIGS. 1 and 2 show the structure of an active matrix liquid crystal display device that utilizes the present invention.

FIG. 1 is a sectional view taken along line A–A' FIG. 2. FIGS. 1 and 2 show the structure of a single pixel that constitutes a pixel area (the pixel area consists of many pixels) of an active matrix liquid crystal display device.

FIGS. 1 and 2 show only the structure on the side of a substrate on which thin-film transistors are arranged. Actually, there exists another substrate opposed to it. A liquid crystal is interposed between the two substrates through a gap of about several micrometers.

In FIGS. 1 and 2 reference numeral 103 denotes a thin-film transistor, and 101 denotes a glass substrate. Alternatively, a quartz substrate may be used. Reference numeral 102 denotes a silicon oxide film as an undercoat film. An active layer of the thin-film transistor 103 consists of a source region 104, offset gate regions 107 and 108, a channel forming region 105, and a drain region 106. The active layer is made of a crystalline silicon film that has been crystallized by heating an amorphous silicon film or illuminating it with laser light.

Reference numeral 109 denotes a silicon oxide film including a gate insulating film, and 110 denotes a gate electrode mainly made of aluminum and extending from a sate line. In FIG. 1, numeral 110 denotes both of the gate electrode and the gate line.

Reference numeral 111 denotes an anodic oxide film that has been formed by anodization using the aluminum gate electrode 110 as the anode.

Reference numeral 112 denotes a first interlayer insulating film that is a silicon oxide film. Numeral 113 denotes a lead-out electrode connected to the source region 104 and extending from a source line. In FIG. 1, numeral 113 denotes both of the source electrode and the source line.

Reference numeral 115 denotes a lead-outline connected to the drain region 106 as well as to an ITO electrode 118 serving as a pixel electrode. Reference numerals 114 and 117 denote second and third interlayer insulating films, respectively.

Reference numeral 116 denotes a titanium electrode also serving as a black matrix. Alternatively, a chromium film or the like may be used. To allow the titanium film 116 to serve as the black matrix, it is so formed as to overlap with the periphery of the pixel electrode 118.

Auxiliary capacitors are formed in regions 119 and 120 where the titanium electrode 116 and the pixel electrode 118 coextend with a portion of the third interlayer insulating film 117 interposed in between. These capacitors can have a large capacitance because the insulating film 117 can be made thin.

Since the titanium electrode 116 shields also the gate line 110 and the source line 113 from light, it can prevent charge generation and accumulation there due to illumination with strong light. The titanium electrode 116 also serves as a shield against external electromagnetic waves: it has a function of preventing the gate line 110 and the source line 113 from acting as an antenna, to thereby prevent the device from receiving undesired signals.

The titanium electrode 116 is so formed as to also cover the thin-film transistor 103. This is to prevent an event that light irradiating the thin-film transistor 103 affects its operation. Further, although not shown in the drawings, the electrode 116 is set to an electrically same potential as a counter electrode.

Although the insulating film 117 is a single layer in the above embodiment, it may have a multi-layer structure.

As described above, by overlapping the black matrix and the periphery of the pixel electrode through the insulating film, the coextending portion serves as the auxiliary capacitor. This structure prevents reduction in pixel aperture ratio. Further, since the insulating film can be made thin, the auxiliary capacitor can have a large capacitance.

The black matrix can provide effective light shielding as well as protect the entire device from external electromagnetic waves.

The present invention can be applied to not only black matrix liquid crystal electro-optical devices but also flat panel displays that require a pixel electrode, a black matrix covering its periphery, and an auxiliary capacitor connected to a thin-film transistor.

What is claimed is:

1. An active matrix display device comprising:
   a substrate;
   a thin film transistor formed over the substrate, said thin film transistor comprising an active layer, a gate insulating film adjacent to the active layer and a gate electrode adjacent to the gate insulating film;
   a gate line formed over said substrate and electrically connected to said gate electrode of the thin film transistor;
   a first insulating film formed over said thin film transistor and said gate line;
   a source line formed over said first insulating film and electrically connected to a source region of said active layer, said source line extending across said gate line;
   a second insulating film formed over said source line;
   a black matrix formed over said second insulating film;
   a conductive layer formed on a same layer as said black matrix;
   a third insulating film formed over said black matrix and said conductive layer; and
   a pixel electrode formed over said third insulating film and electrically connected to a drain region of the active layer through at least said conductive layer,
   wherein said black matrix is overlapped with a periphery of said pixel electrode at least partly, and said black matrix covers said source line.

2. The active matrix display device according to claim 1 wherein said active layer comprises crystalline silicon.

3. The active matrix display device according to claim 1 wherein both of said black matrix and said conductive layer comprise titanium.

4. The active matrix display device according to claim 1 wherein both of said black matrix and said conductive layer comprise chromium.

5. The active matrix display device according to claim 1 wherein said first insulating film comprises silicon oxide.

6. The active matrix display device according to claim 1 wherein said gate line is formed on a same layer as said gate electrode.

7. The active matrix display device according to claim 1 wherein said pixel electrode comprises indium tin oxide.

8. An active matrix display device comprising:
   a substrate:
   a thin film transistor formed over the substrate, said thin film transistor comprising an active layer, a gate insulating film adjacent to the active layer and a gate electrode adjacent to the gate insulating film;
   a gate line formed over said substrate and electrically connected to said gate electrode of the thin film transistor;
   a first insulating film formed over said thin film transistor and said gate line;
   a source line formed over said first insulating film and electrically connected to a source region of said active layer, said source line extending across said gate line;
   a second insulating film formed over said source line;
   a black matrix formed over said second insulating film;
   a conductive layer formed on a same layer as said black matrix;
   a third insulating film formed over said black matrix and said conductive layer; and
   a pixel electrode formed over said third insulating film and electrically connected to a drain region of the active layer through at least said conductive layer,
   wherein said black matrix is overlapped with a periphery of said pixel electrode at least partly, and said black matrix covers said source line and said gate line.

9. The active matrix display device according to claim 8 wherein said active layer comprises crystalline silicon.

10. The active matrix display device according to claim 8 wherein both of said black matrix and said conductive layer comprise titanium.

11. The active matrix display device according to claim 8 wherein both of said black matrix and said conductive layer comprise chromium.

12. The active matrix display device according to claim 8 wherein said first insulating film comprises silicon oxide.

13. The active matrix display device according to claim 8 wherein said gate line is formed on a same layer as said gate electrode.

14. The active matrix display device according to claim 8 wherein said pixel electrode comprises indium tin oxide.

15. An active matrix display device comprising:
   a substrate:
   a thin film transistor formed over the substrate, said thin film transistor comprising an active layer, a gate insulating film adjacent to the active layer and a gate electrode adjacent to the gate insulating film;
   a gate line formed over said substrate and electrically connected to said gate electrode of the thin film transistor;
   a first insulating film formed over said thin film transistor and said gate line;
   a source line formed over said first insulating film and electrically connected to a source region of said active layer, said source line extending across said gate line;
   a second insulating film formed over said source line;
   a black matrix formed over said second insulating film;
   a conductive layer formed on a same layer as said black matrix;
   a third insulating film formed over said black matrix and said conductive layer; and
   a pixel electrode formed over said third insulating film and electrically connected to a drain region of the active layer through at least said conductive layer,
   wherein said black matrix is overlapped with a periphery of said pixel electrode at least partly, and said black matrix covers said source line and said gate electrode.

16. The active matrix display device according to claim 15 wherein said active layer comprises crystalline silicon.

17. The active matrix display device according to claim 15 wherein both of said black matrix and said conductive layer comprise titanium.

18. The active matrix display device according to claim 15 wherein both of said black matrix and said conductive layer comprise chromium.

19. The active matrix display device according to claim 15 wherein said first insulating film comprises silicon oxide.

20. The active matrix display device according to claim 15 wherein said gate line is formed on a same layer as said gate electrode.

21. The active matrix display device according to claim 15 wherein said pixel electrode comprises indium tin oxide.

22. An active matrix display device comprising:
a substrate:
a thin film transistor formed over the substrate, said thin film transistor comprising an active layer, a gate insulating film adjacent to the active layer and a gate electrode adjacent to the gate insulating film;
a gate line formed over said substrate and electrically connected to said gate electrode of the thin film transistor;
a first insulating film formed over said thin film transistor and said gate line;
a source line formed over said first insulating film and electrically connected to a source region of said active layer, said source line extending across said gate line;
a second insulating film formed over said source line;
a light shielding electrode formed over said second insulating film;
a conductive layer formed on a same layer as said light shielding electrode;
a third insulating film formed over said light shielding electrode and said conductive layer; and
a pixel electrode formed over said third insulating film and electrically connected to a drain region of the active layer through at least said conductive layer,
wherein said light shielding electrode is overlapped with a periphery of said pixel electrode at least partly, and said light shielding electrode covers said source line.

23. The active matrix display device according to claim 22 wherein said active layer comprises crystalline silicon.

24. The active matrix display device according to claim 22 wherein both of said light shielding electrode and said conductive layer comprise titanium.

25. The active matrix display device according to claim 22 wherein both of said light shielding electrode and said conductive layer comprise chromium.

26. The active matrix display device according to claim 22 wherein said first insulating film comprises silicon oxide.

27. The active matrix display device according to claim 22 wherein said gate line is formed on a same layer as said gate electrode.

28. The active matrix display device according to claim 22 wherein said pixel electrode comprises indium tin oxide.

29. An active matrix display device comprising:
a substrate:
a thin film transistor formed over the substrate, said thin film transistor comprising an active layer, a gate insulating film adjacent to the active layer and a gate electrode adjacent to the gate insulating film;
a gate line formed over said substrate and electrically connected to said gate electrode of the thin film transistor;
a first insulating film formed over said thin film transistor and said gate line;
a source line formed over said first insulating film and electrically connected to a source region of said active layer, said source line extending across said gate line;
a second insulating film formed over said source line;
a light shielding electrode formed over said second insulating film;
a conductive layer formed on a same layer as said light shielding electrode;
a third insulating film formed over said light shielding electrode and said conductive layer; and
a pixel electrode formed over said third insulating film and electrically connected to a drain region of the active layer through at least said conductive layer,
wherein said light shielding electrode is overlapped with a periphery of said pixel electrode at least partly, and said light shielding electrode covers said source line and said gate line.

30. The active matrix display device according to claim 29 wherein said active layer comprises crystalline silicon.

31. The active matrix display device according to claim 29 wherein both of said light shielding electrode and said conductive layer comprise titanium.

32. The active matrix display device according to claim 29 wherein both of said light shielding electrode and said conductive layer comprise chromium.

33. The active matrix display device according to claim 29 wherein said first insulating film comprises silicon oxide.

34. The active matrix display device according to claim 29 wherein said gate line is formed on a same layer as said gate electrode.

35. The active matrix display device according to claim 29 wherein said pixel electrode comprises indium tin oxide.

36. An active matrix display device comprising:
a substrate:
a thin film transistor formed over the substrate, said thin film transistor comprising an active layer, a gate insulating film adjacent to the active layer and a gate electrode adjacent to the gate insulating film;
a gate line formed over said substrate and electrically connected to said gate electrode of the thin film transistor;
a first insulating film formed over said thin film transistor and said gate line;
a source line formed over said first insulating film and electrically connected to a source region of said active layer, said source line extending across said gate line;
a second insulating film formed over said source line;
a light shielding electrode formed over said second insulating film;
a conductive layer formed on a same layer as said light shielding electrode;
a third insulating film formed over said light shielding electrode and said conductive layer; and
a pixel electrode formed over said third insulating film and electrically connected to a drain region of the active layer through at least said conductive layer,
wherein said light shielding electrode is overlapped with a periphery of said pixel electrode at least partly, and said light shielding electrode covers said source line and said gate electrode.

37. The active matrix display device according to claim 36 wherein said active layer comprises crystalline silicon.

38. The active matrix display device according to claim 36 wherein both of said light shielding electrode and said conductive layer comprise titanium.

39. The active matrix display device according to claim 36 wherein both of said light shielding electrode and said conductive layer comprise chromium.

40. The active matrix display device according to claim 36 wherein said first insulating film comprises silicon oxide.

41. The active matrix display device according to claim 36 wherein said gate line is formed on a same layer as said gate electrode.

42. The active matrix display device according to claim 36 wherein said first insulating film comprises silicon oxide.

43. The active matrix display device according to claim 36 wherein said gate line is formed on a same layer as said gate electrode.

44. The active matrix display device according to claim 36 wherein said pixel electrode comprises indium tin oxide.

* * * * *